United States Patent
Ono et al.

(10) Patent No.: US 8,058,688 B2
(45) Date of Patent: Nov. 15, 2011

(54) SEMICONDUCTOR DEVICE

(75) Inventors: Syotaro Ono, Kanagawa-ken (JP); Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1043 days.

(21) Appl. No.: 11/864,101

(22) Filed: Sep. 28, 2007

(65) Prior Publication Data

US 2008/0237774 A1    Oct. 2, 2008

(30) Foreign Application Priority Data

Sep. 29, 2006  (JP) .................. 2006-268273

(51) Int. Cl.
*H01L 31/119* (2006.01)
(52) U.S. Cl. .................. 257/341; 257/328; 257/401
(58) Field of Classification Search .................. 257/341, 257/328, 401
See application file for complete search history.

(56) References Cited

U.S. PATENT DOCUMENTS

| | | | |
|---|---|---|---|
| 6,307,246 B1 * | 10/2001 | Nitta et al. ............ | 257/493 |
| 6,673,679 B1 * | 1/2004 | Miyasaka et al. ............ | 438/268 |
| 6,693,338 B2 | 2/2004 | Saitoh et al. | |
| 6,888,195 B2 * | 5/2005 | Saito et al. ............ | 257/328 |
| 6,919,610 B2 | 7/2005 | Saitoh et al. | |
| 7,161,209 B2 | 1/2007 | Saito et al. | |
| 2006/0194391 A1 | 8/2006 | Saggio et al. | |

FOREIGN PATENT DOCUMENTS

| | | |
|---|---|---|
| JP | 2004-72068 | 3/2004 |
| JP | 2004-119611 | 4/2004 |
| JP | 2004-214511 | 7/2004 |
| JP | 3634848 | 1/2005 |

\* cited by examiner

*Primary Examiner* — Samuel Gebremariam
(74) *Attorney, Agent, or Firm* — Oblon, Spivak, McClelland, Maier & Neustadt, L.L.P.

(57) ABSTRACT

A semiconductor device includes: a semiconductor substrate; a first semiconductor layer of a first conductivity type provided on a major surface of the semiconductor substrate and having lower doping concentration than the semiconductor substrate; a plurality of first semiconductor column regions of the first conductivity type provided on the first semiconductor layer;

a plurality of second semiconductor column regions of a second conductivity type provided on the first semiconductor layer, the second semiconductor column regions being adjacent to the first semiconductor column regions; a first semiconductor region; a second semiconductor region; a gate insulating film; a first main electrode; a second main electrode; and a control electrode. Doping concentrations in both the first and second semiconductor column region are low on the near side of the first semiconductor layer and high on the second main electrode side.

20 Claims, 7 Drawing Sheets

SEMICONDUCTOR DEVICE

CROSS-REFERENCE TO RELATED APPLICATIONS

This application is based upon and claims the benefit of priority from the prior Japanese Patent Application No. 2006-268273, filed on Sep. 29, 2006; the entire contents of which are incorporated herein by reference.

BACKGROUND OF THE INVENTION

1. Field of the Invention

This invention relates to a semiconductor device, and more particularly to a semiconductor device having a semi-super junction structure.

2. Background Art

Vertical MOSFET (metal-oxide-semiconductor field effect transistor) devices are used for power electronics applications. The ON resistance of such a MOSFET device greatly depends on the electric resistance of its conduction layer (drift layer). The electric resistance of the drift layer is determined by its doping concentration. The ON resistance can be decreased by increasing the doping concentration. However, increase of the doping concentration results in decreasing the breakdown voltage of a pn junction formed by the drift layer and the base layer. Hence it is difficult to substantially increase the doping concentration. Thus there is a tradeoff between device breakdown voltage and ON resistance. Improving this tradeoff is a significant challenge for realizing power semiconductor devices with low power consumption and high breakdown voltage.

As an example MOSFET device improving this tradeoff, JP-A 2004-119611 (Kokai) discloses a structure known as a "super junction structure" in which p-type column regions and n-type column regions shaped like vertically elongated strips are laterally and alternately juxtaposed in the drift layer. In the super junction structure, a non-doped layer can be artificially produced by nearly equalizing the concentration of dopant contained in the p-type column region and in the n-type column region. Thus, while supporting high breakdown voltage, a current is allowed to flow through the highly doped n-type column region, and thereby low ON resistance beyond the material limit can be realized.

The breakdown voltage of such a MOSFET having a super junction structure can be further enhanced by increasing the layer thickness of the p-type column region and the n-type column region. However, if the repetition pitch of the p-type column region and the n-type column region is left unchanged, thickening the column regions results in increasing the aspect ratio of the p-type column region and the n-type column region, and the process for forming them becomes difficult. On the other hand, high breakdown voltage can be achieved also by decreasing the concentration in the p-type column region and the n-type column region and thickening the column regions to increase the repetition pitch with the aspect ratio kept constant. However, in this case, although high breakdown voltage is obtained, the ON resistance substantially increases because of low doping concentration in the n-type column region, where current flows at turn-on time.

In this respect, Japanese Patent No. 3634848 discloses a semiconductor device in which an n-type layer is inserted on the collector side of the p-type column region and the n-type column region. Thus the breakdown voltage is supported by both the super junction section and the n-type layer, thereby increasing the breakdown voltage of the device. In this case, the breakdown voltage of the device can be increased without requiring substantial changes in the current process for forming the super junction structure. The proportion of the p-type column region and the n-type column region occupying the drift layer favors the tradeoff between breakdown voltage and ON resistance as compared with the uniform structure of the conventional n-type drift layer.

SUMMARY OF THE INVENTION

According to an aspect of the invention, there is provided a semiconductor device including: a semiconductor substrate; a first semiconductor layer of a first conductivity type provided on a major surface of the semiconductor substrate and having lower doping concentration than the semiconductor substrate; a plurality of first semiconductor column regions of the first conductivity type provided on the first semiconductor layer; a plurality of second semiconductor column regions of a second conductivity type provided on the first semiconductor layer, the second semiconductor column regions being adjacent to the first semiconductor column regions; a first semiconductor region of the second conductivity type provided on the second semiconductor column region; a second semiconductor region of the first conductivity type selectively provided in a surface of the first semiconductor region; a gate insulating film extending from the second semiconductor region via the first semiconductor region onto the first semiconductor column region; a first main electrode provided on a surface of the semiconductor substrate, the surface being on the opposite side of the major surface; a second main electrode provided on the second semiconductor region; and a control electrode provided on the gate insulating film configured to control a current path between the second main electrode and the first semiconductor column regions, doping concentrations in both the first and second semiconductor column region being low on the near side of the first semiconductor layer and high on the second main electrode side.

According to another aspect of the invention, there is provided a semiconductor device including: a semiconductor substrate; a first semiconductor layer of a first conductivity type provided on a major surface of the semiconductor substrate and having lower doping concentration than the semiconductor substrate; a plurality of first semiconductor column regions of the first conductivity type provided on the first semiconductor layer; a plurality of second semiconductor column regions of a second conductivity type provided on the first semiconductor layer, the second semiconductor column regions being adjacent to the first semiconductor column regions; a first main electrode provided on a surface of the semiconductor substrate, the surface being on the opposite side of the major surface; a second main electrode provided on the second semiconductor column regions; and a control electrode for controlling a current path between the second main electrode and the first semiconductor column regions, a doping concentration in the second semiconductor column region having a distribution that is low on the near side of the first semiconductor layer and high on the far side of the first semiconductor layer, and a doping concentration in the first semiconductor layer being lower than the doping concentration in the second semiconductor column region near its interface with the first semiconductor layer.

DETAILED DESCRIPTION OF THE INVENTION

An embodiment of the invention will now be described with reference to the drawings.

Figure 1:
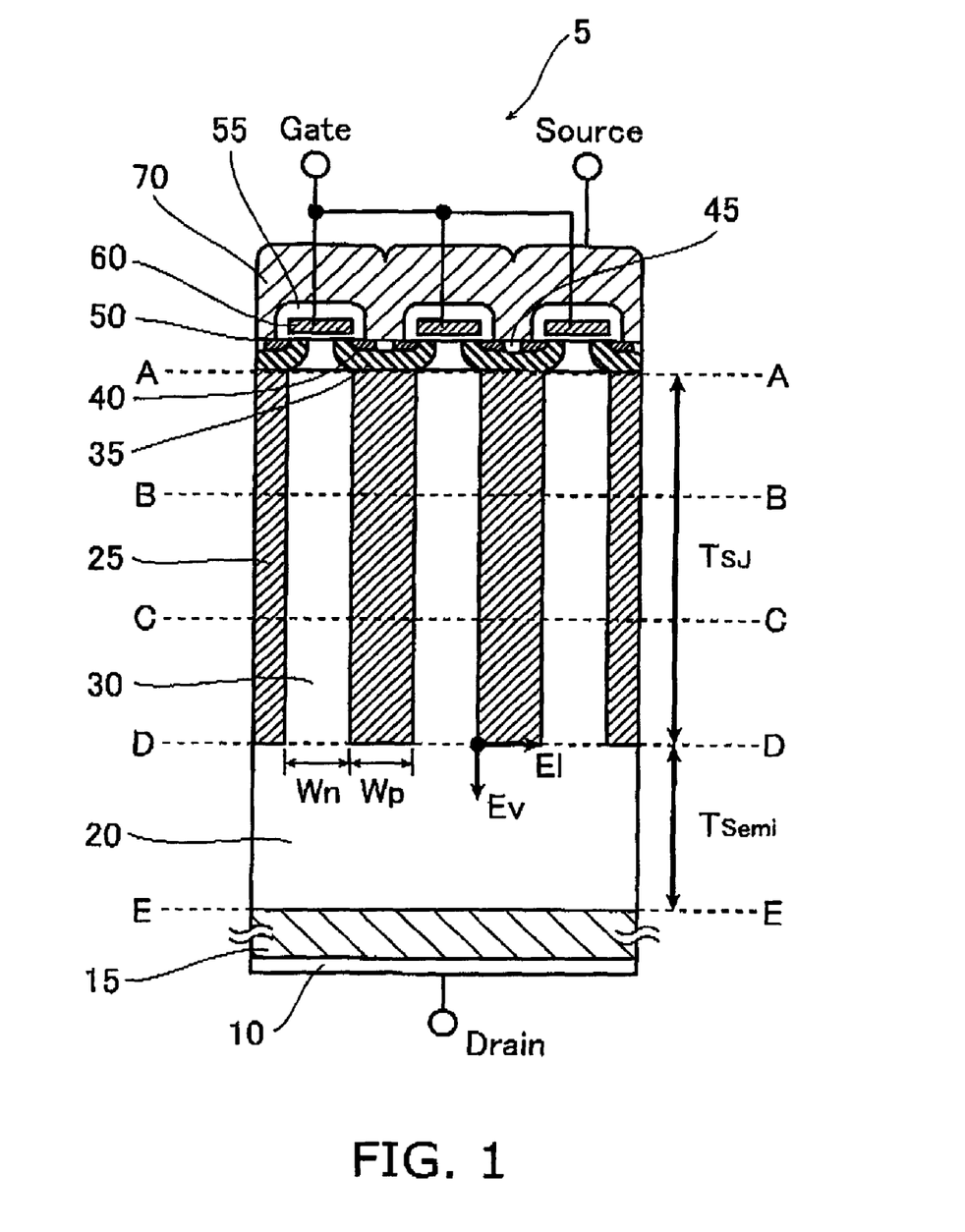
FIG. 1 is a schematic cross-sectional view showing a first example of a semiconductor device of this embodiment.

FIG. 1 is a schematic cross-sectional view showing a first example of a semiconductor device of this embodiment.

The semiconductor device 5 of this example includes a highly doped n-type (n$^+$-type) semiconductor substrate 15. A low doped n-type (n$^-$-type) semiconductor layer (first semiconductor layer) 20 is formed on the n-type semiconductor substrate 15. The n$^-$-type semiconductor layer 20 has a doping concentration of $1.5 \times 10^{15}$ cm$^{-3}$, for example. On the major surface of the n$^-$-type semiconductor layer 20, p-type column regions (second semiconductor column regions) 25 and n-type column regions (first semiconductor column regions) 30 are formed laterally and alternately juxtaposed. The structure including these column regions 25, 30 is referred to as a "super junction structure". In addition, the structure having the super junction structure on the n$^-$-type semiconductor layer 20 is referred to as a "semi-super junction structure". The p-type column region 25 and the n-type column region 30 are each shaped like a stripe. The stripe width Wn of the n-type column region 30 and the stripe width Wp of the p-type column region 25 are approximately 6 micrometers (Wn=Wp), for example. The thickness $T_{SJ}$ of these column regions 25, 30 can be e.g. approximately 50 to 90 percent of the overall thickness of the drift layer (the sum of the thickness $T_{SJ}$ of the column region and the thickness $T_{semi}$ of the n$^-$-type semiconductor layer 20). Specifically, when the drift layer has an overall thickness of e.g. 55 micrometers, the thickness $T_{SJ}$ of the column regions 25, 30 can be 65 percent thereof, or approximately 35 micrometers.

A base region (first semiconductor region) 35 made of p-type silicon is provided at the top of the p-type column region 25. Part of the base region 35 is connected also to the n-type column region 30, forming a pn junction. Source regions (second semiconductor region) 40 made of n$^+$-type silicon are selectively formed in the surface of the base region 35. A highly doped p-type (p$^+$-type) region 45 connected to the base region 35 is formed between these source regions 40. A gate insulating film 50 is formed on the n-type column region 30, the selectively formed source regions 40, and the base regions 35 between the n-type column region 30 and the source regions 40 A gate electrode (control electrode) 60 is formed on the gate insulating film 50. Here, for example, the doping concentration in the base region 35 opposed to the gate electrode (control electrode) 60 across the gate insulating film 50 has a maximum of approximately $3.0 \times 10^{16}$ to $3.0 \times 10^{17}$ cm$^{-3}$. The doping concentration in the source region 40 and the p$^+$-type region 45 can be selected to be a high concentration that enables ohmic contact with metal material.

The side face and the upper face of the gate electrode 60 are covered with an insulating film (gate insulating film) 55. A source electrode (second main electrode) 70 is formed on the p$^+$-type region 45, the source region 40 near the p$^+$-type region 45, and the insulating film 55. The source electrode 70 is in ohmic contact with both the source region 40 and the base region 35. A drain electrode (first main electrode) 10 is formed on the n$^+$-type semiconductor substrate 15 on the opposite side of the n$^-$-type semiconductor layer 20 and is in ohmic contact with the n$^+$-type semiconductor substrate 15.

Figure 2:
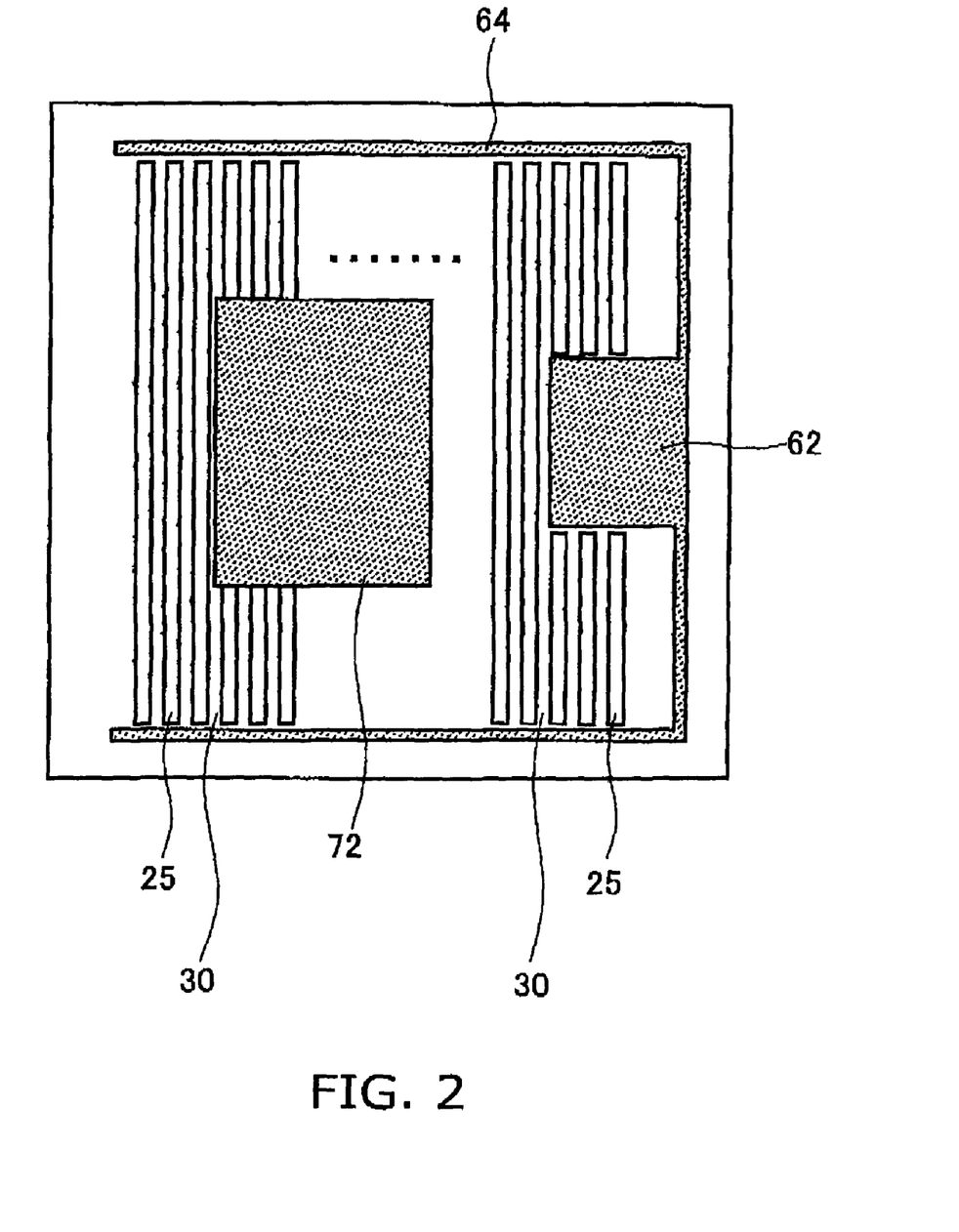
FIG. 2 is a schematic view illustrating the planar structure of this semiconductor device.

FIG. 2 is a schematic view illustrating the planar structure of this semiconductor device.

In this structure, a gate electrode pad 62 connected to the gate electrode 60 through a gate interconnect 64, and a source electrode pad 72 connected to the source electrode 70 are formed in the surface of the semiconductor device 5.

In this embodiment, the doping concentration in the p-type column region 25 and the n-type column region 30 varies substantially vertically upward with respect to the major surface of the n$^-$-type semiconductor layer 20.

Figure 3A:
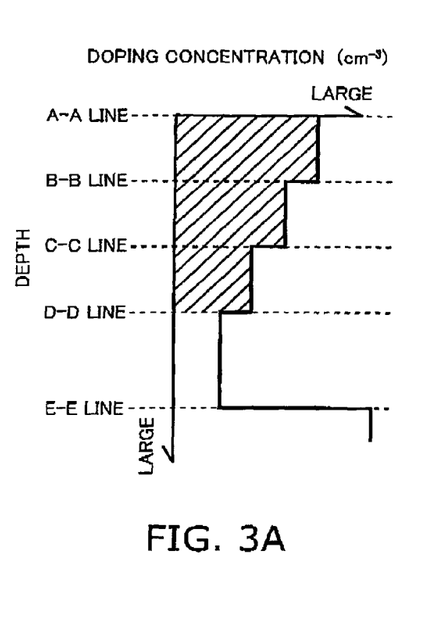
FIG. 3A is a graph showing the depthwise distribution of doping concentration in a semiconductor device of the first example.
Figure 3B:
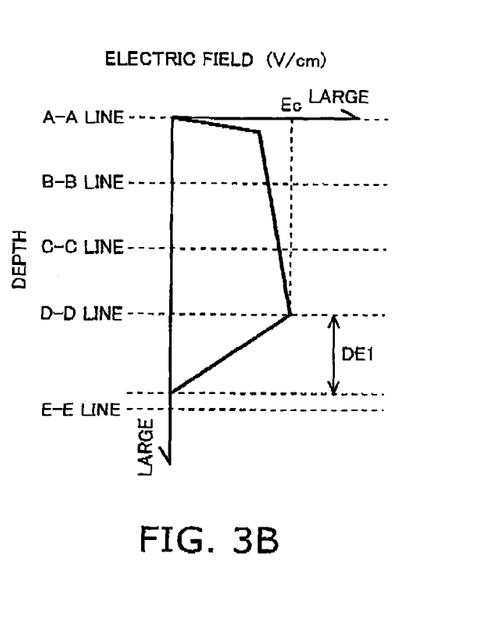
FIG. 3B is a graph showing the depthwise distribution of electric field strength in the semiconductor device of the first example.

FIG. 3A is a graph showing the depthwise distribution of doping concentration in the p-type column region and the n-type column region, and FIG. 3B is a graph showing the depthwise distribution of electric field strength therein.

Figure 4A:
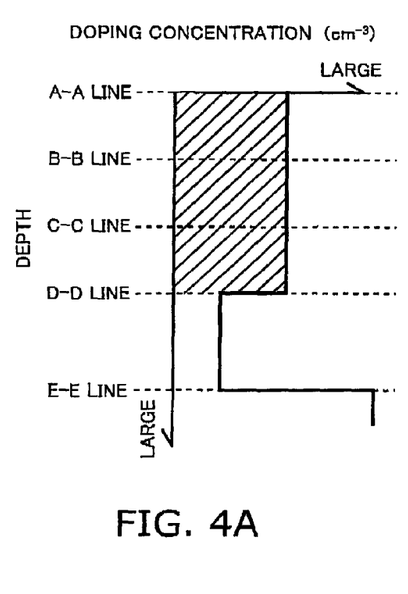
FIG. 4A is a graph showing the depthwise distribution of doping concentration in a semiconductor device of a comparative example.
Figure 4B:
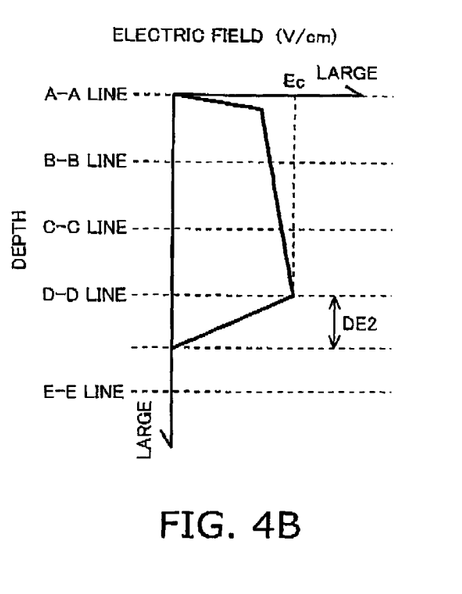
FIG. 4B is a graph showing the depthwise distribution of electric field strength in this semiconductor device.

FIG. 4A is a graph showing the depthwise distribution of doping concentration in a semiconductor device of a comparative example, and FIG. 4B is a graph showing the depthwise distribution of electric field strength in this semiconductor device.

In FIGS. 1, 3, and 4, the A-A line represents the position of the interface that the p-type column region 25 and the n-type column region 30 make with the base region 35. The D-D line is located near the interface that the p-type column region 25 and the n-type column region 30 make with the n$^-$-type semiconductor layer 20. The E-E line is located near the interface between the n$^-$-type semiconductor layer 20 and the n$^+$-type semiconductor substrate 15. The B-B line and the C-C line are provided in this order between the A-A line and the D-D line. The distance between the A-A line and the D-D line is the thickness of the p-type column region 25 and the n-type column region 30, and the distance between the D-D line and the E-E line is the thickness of the n$^-$-type semiconductor layer 20.

As shown in FIG. 3A, in this embodiment, the doping concentrations in the p-type column region 25 and the n-type column region 30 increase stepwise, substantially vertically upward with respect to the major surface of the n$^-$-type semiconductor layer 20. In particular, by increase with three or more steps, a semiconductor device with low ON resistance and high breakdown voltage is obtained. The doping concentration in these column regions 25, 30 may be varied along the depth in a continuous or undulating pattern instead of the stepwise pattern. The doping concentration at the bottom of the p-type column region 25 and the n-type column region 30 is preferably higher than the doping concentration in the n$^-$-type semiconductor layer 20.

On the other hand, in the comparative example shown in FIG. 4, the doping concentration in the p-type column region and the n-type column region is constant along the depth. In the semiconductor device of this embodiment shown in FIG. 3 and in the semiconductor device of the comparative example shown in FIG. 4, the total dopant in the p-type column region 25 and the n-type column region 30, or the integrated amount of doping concentration, is comparable.

Next, the operation of the semiconductor device of this embodiment and of the comparative example is described.

In operation, electric field concentrates on the interface between the p-type column region 25, the n-type column region 30 and the n⁻-type semiconductor layer 20. More specifically, a lateral electric field El occurs between the p-type column region 25 and the n-type column region 30, and a vertical electric field Ev occurs between the column region and the n⁻-type semiconductor layer 20.

Of these electric fields, the lateral electric field El can be held down if the total dopant in the p-type column region 25 is made comparable with the total dopant in the n-type column region 30. That is, the device breakdown voltage can be increased in this direction.

On the other hand, with regard to the vertical electric field Ev, a depletion layer extends from the column region into the n⁻-type semiconductor layer 20 and exhibits the behavior like in a pn junction. That is, in the comparative example, the vertical electric field Ev shown in FIG. 4B has a high peak, which tends to decrease device breakdown voltage.

To prevent this, it is contemplated to decrease the doping concentration in the n⁻-type semiconductor layer 20. That is, decreasing the doping concentration in the n⁻-type semiconductor layer 20 allows the depletion layer to extend more easily into the n⁻-type semiconductor layer 20 at any drain voltages. Thus the peak of the electric field Ev is alleviated, and the device breakdown voltage increases.

However, decreasing the concentration in the n⁻-type semiconductor layer 20 results in an increase of the device ON resistance. To overcome this, it is necessary to adopt a structure that can alleviate the vertical electric field Ev despite high doping concentration in the n⁻-type semiconductor layer 20.

In general, in a pn junction, when the n-type layer has a constant doping concentration, the depletion layer spreads also to the p-type layer side by decreasing the doping concentration in the p-type layer. Thus the electric field at the junction interface is alleviated, and the depletion layer extends more easily also to the n-layer side.

Hence, in the present example, the doping concentration in the p-type column region 25 is varied vertically (depthwise), and thereby the doping concentration in the p-type column region 25 is decreased near the interface with the n⁻-type semiconductor layer 20. Thus the p-type column region 25 is depleted more easily near the interface with the n⁻-type semiconductor layer 20, and the peak of the electric field Ev can be alleviated as shown in FIG. 3B. By comparison between FIG. 3B and FIG. 4B where the n⁻-type semiconductor layer 20 has the same doping concentration, it turns out that the depletion layer extends farther into the n⁻-type semiconductor layer 20 in FIG. 3B. That is, the distance DES in FIG. 3B is larger than the distance DE2 in FIG. 4B.

A voltage at which the peak of the vertical electric field Ev reaches to a critical electric field Ec corresponds to the breakdown voltage. The values of the critical electric field Ec of the semiconductor device according to this embodiment and comparative example are substantially the same. However, in the semiconductor device according to this embodiment, the depletion layer can extend wider (or deeper) in the vertical direction in the n-type semiconductor layer before the electric field reaches to the critical electric field Ec, because the vertical electric field Ev in the lower portion of the column region is alleviated. Furthermore, the wide (or deep) expansion of the depletion layer makes the electric field to be extended to deep region in the n-type semiconductor layer. The area of the electric field shown in FIG. 3B corresponds to the breakdown voltage. Therefore, the semiconductor device according to this embodiment can realize a high breakdown voltage because width of expansion of the electric field in the depth direction is increased even though its critical electric field Ec is substantially the same as the comparative example.

Thus, according to this embodiment, the device breakdown voltage can be increased while avoiding the increase of ON resistance due to the decrease of doping concentration in the n⁻-type semiconductor layer 20.

Here, by varying also the doping concentration in the n-type column region 30 in accord with the doping concentration in the p-type column region 25, the concentration of p-type dopant and n-type dopant is balanced in these column regions, and the lateral electric field El can be also restrained.

In this embodiment, the doping concentration in the p-type column region 25 and the n-type column region 30 can be decreased only near the interface with the n⁻-type semiconductor layer 20. If the doping concentration in the p-type column region 25 and the n-type column region 30 were entirely decreased, the ON resistance of the super junction section would increase. Hence the distribution of dopant in the p-type column region 25 and the n-type column region 30 can be adjusted so that, for example, the amount of dopant is increased on the upside (on the near side of the base region 35) by the amount of its decrease near the interface with the n⁻-type semiconductor layer 20. Then the total doping concentration in the column regions 25, 30 can be maintained, and the ON resistance is not substantially affected.

Figure 5:
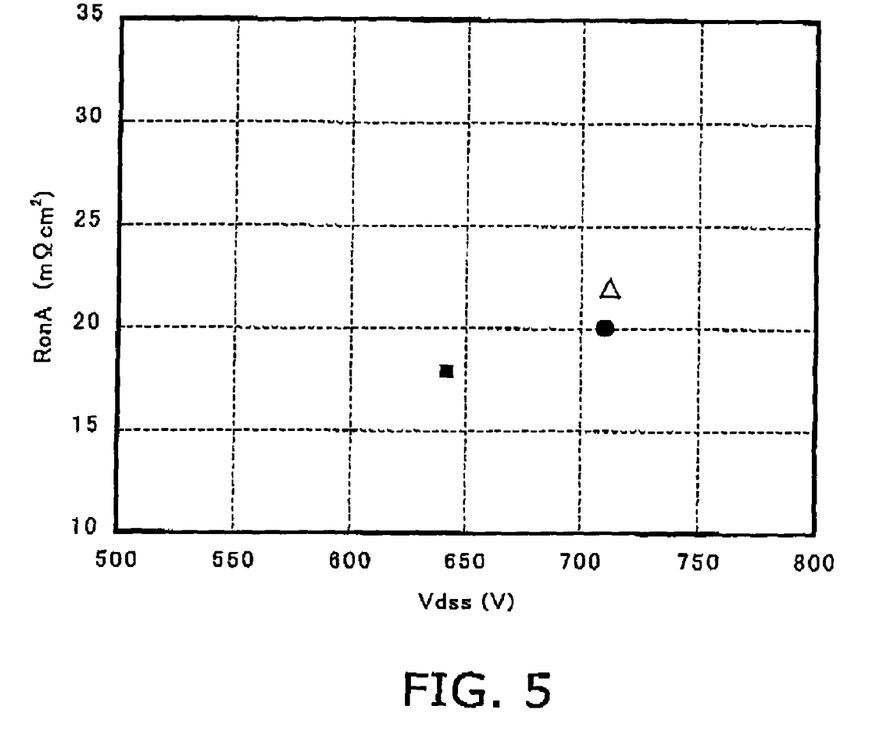
FIG. 5 is a graph showing the relationship between breakdown voltage and ON resistance of the semiconductor device of the present example and the comparative examples.

FIG. 5 is a graph showing the relationship between breakdown voltage and ON resistance of the semiconductor device of the present example and the comparative example.

In this figure, the horizontal axis represents device breakdown voltage (Vdss, in volts), and the vertical axis represents ON resistance (RonA, in mΩcm²).

In FIG. 5, the solid square (■) represents the case of a super junction structure of the first comparative example lacking the n⁻-type semiconductor layer 20. An n-type semiconductor layer is formed also on the collector side of the column region, but provided with the same concentration as in the n-type column region. In contrast, the hollow triangle represents the second comparative example having a semi-super junction structure with the n⁻-type semiconductor layer formed on the collector side of the column region. By applying the result of this semi-super junction structure (hollow triangle) to the present example, the tradeoff between device breakdown voltage and ON resistance can be improved to the level represented by the solid circle (●).

The device of the present example represented by the solid circle (●) has the structure described above with reference to FIGS. 1 to 3. The width Wp of the p-type column region 25 and the width Wn of the n-type column region 30 are both 6 micrometers, the overall thickness of the drift layer ($T_{SJ}$+ $T_{semi}$) is 55 micrometers, and the thickness $T_{SJ}$ of the column region is 35 micrometers.

In FIGS. 1 and 3, the p-type column region 25 and the n-type column region 30 have a doping concentration of $4 \times 10^{15}$ cm⁻³ between the A-A line and the B-B line, $3 \times 10^{15}$ cm⁻³ between the B-B line and the C-C line, $2 \times 10^{15}$ cm⁻³ between the C-C line and the D-D line, and $1.5 \times 10^{15}$ cm⁻³ between the D-D line and the E-E line, or in the n⁻-type semiconductor layer 20.

On the other hand, in the first comparative example represented by the solid square, the doping concentration in the p-type column region 25 and the n-type column region 30 is not provided with varied distribution, but set to a constant value of $3 \times 10^5$ cm$^{-3}$, with the size of each section having the same dimensions as in the present example. The doping concentration in the n$^-$-type semiconductor layer 20 is set to $3 \times 10^{15}$ cm$^{-3}$, equal to the doping concentration in the n-type column region 30.

Also in the second comparative example represented by the hollow triangle, the doping concentration in the p-type column region 25 and the n-type column region 30 is not provided with varied distribution, but set to a constant value of $3 \times 10^{15}$ cm$^{-3}$ with the size of each section having the same dimensions as in the present example. However, the doping concentration in the n$^-$-type semiconductor layer 20 is set to $7 \times 10^{14}$ cm$^{-3}$, lower than the doping concentration in the n-type column region 30.

In the first comparative example where the doping concentration in the n$^-$-type semiconductor layer 20 is not decreased (solid square), the device breakdown voltage is 642 volts, and the ON resistance is 18 m$\Omega$cm$^2$. In contrast, in the second comparative example where the doping concentration in the n$^-$-type semiconductor layer 20 is decreased to $7 \times 10^{14}$ cm$^{-3}$ (hollow triangle), the device breakdown voltage increases to 712 volts, but the ON resistance also increases to 22 m$\Omega$cm$^2$. However, it improves the tradeoff between device breakdown voltage and ON resistance relative to the result of the solid square (■).

In contrast, according to the present example (solid circle ●), the device breakdown voltage increases to 710 volts, and the ON resistance can be held down to 20 m$\Omega$cm$^2$. That is, by varying the distribution of doping concentration in the p-type column region 25 and the n-type column region 30, the electric field near the interface with the n$^-$-type semiconductor layer 20 is alleviated, and the device breakdown voltage can be increased while preventing the increase of ON resistance.

Figure 6A:
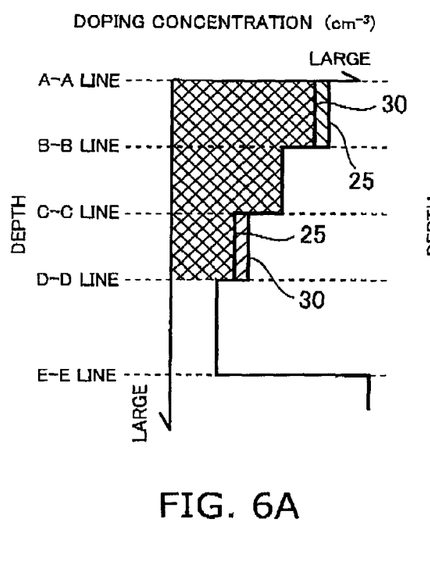
FIG. 6A is a graph showing the depthwise distribution of doping concentration in a semiconductor device of the second example.
Figure 6B:
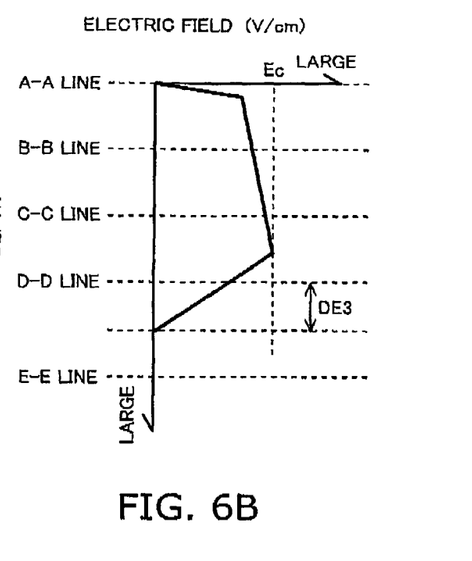
FIG. 6B is a graph showing the depthwise distribution of electric field in the semiconductor device of this example.

Next, a second example of this embodiment is described. FIG. 6A is a graph showing the depthwise distribution of doping concentration in a semiconductor device of the second example, and FIG. 6B is a graph showing the depthwise distribution of electric field in the semiconductor device of this example.

Also in this example, as in the example shown in FIG. 3, the doping concentration in the p-type column region 25 and the n-type column region 30 increases stepwise along the depth. However, in this example, the distribution of doping concentration in the p-type column region 25 is not identical to the distribution of doping concentration in the n-type column region 30. Specifically, on the downside, or on the near side of the n$^-$-type semiconductor layer 20, the doping concentration in the p-type column region 25 is lower than the doping concentration in the n-type column region 30. On the other hand, on the upside, or on the near side of the base region 35, the doping concentration in the p-type column region 25 is higher than the doping concentration in the n-type column region 30. That is, the doping concentration in the column regions is p-type rich on the upside and n-type rich on the downside.

Also in this example, the doping concentration in the p-type column region 25 is decreased near the interface with the n$^-$-type semiconductor layer 20. Thus the electric field can be alleviated by extending the depletion layer. For example, the distance DE3 in FIG. 6B is larger than the distance DE2 in FIG. 4B of the comparative example. Consequently, the device breakdown voltage can be increased. Furthermore, near the interface with the n$^-$-type semiconductor layer 20, the doping concentration in the n-type column region 30 is made slightly higher than the doping concentration in the p-type column region 25, and thereby the ON resistance can be decreased. This is because, when a current flows from the n-type column region 30 into the n$^-$-type semiconductor layer 20, the slight increase of doping concentration in the n-type column region 30 near the interface allows the current to spread more easily in the lateral direction. That is, the ON resistance can be decreased by reducing the lateral spreading resistance in the n-type column region 30 against the current flowing from the n-type column region 30 into the n$^-$-type semiconductor layer 20.

Thus, according to the second example, the breakdown voltage is increased by alleviating electric field near the interface between the n$^-$-type semiconductor layer 20 and the p-type column region 25. At the same time, the ON resistance can be also decreased by reducing the spreading resistance in the n-type column region 30.

In the foregoing, for clearly describing the examples of the invention, the net amount of dopant in the n-type column region 30 is assumed to be equal to that in the p-type column region 25. However, the invention is not limited thereto. For example, the effect of alleviating electric field according to the invention can be achieved in the following situation: Both in the first and second example, the doping concentration is the same in the n-type column region 30 and in the p-type column region 25 adjacent to the n$^-$-type semiconductor layer 20, and the concentration in the n-type column region 30 and the concentration in the p-type column region 25 increase toward the A-A line side, but the concentration in the p-type column region 25 is increased relative to that in the n-type column region 30 as the distance to the A-A line becomes shorter.

By using the structure according to the invention, the Vd-Id characteristic in a turn-on state can be also improved. The Vd-Id characteristic is obtained when the current density is further increased, or the drain voltage is increased, while the gate is turned on and current is flowing through the n-type column region 30. When the current density increases and the drain voltage increases, the depletion layer begins to spread from the p-type column region 25 into the n-type column region 30, and current saturation is ultimately attained. This phenomenon, which is particularly prominent near the boundary between the column region and the n$^-$-type semiconductor layer 20, becomes pronounced when the p-type column region 25 is highly doped, or when the p-type column region 25 is doped more highly than the n-type column region 30. Then the depletion layer extending from the p-type column region 25 tends to connect with each other (pinch-off). However, the structure of the invention can be also applied to this phenomenon. Then pinch-off can be prevented up to large current density, and the device can be operated at large current density. In particular, the Vd-Id characteristic is significantly improved in the second example.

In describing the embodiment of the invention, the device structure and concentration are illustrated with reference to a device breakdown voltage of approximately 600 to 750 V. However, by decreasing the concentration in the n$^-$-type semiconductor layer 20 and increasing the thickness thereof, a device breakdown voltage of 800 to 1500 V or more can be achieved. Furthermore, by decreasing the concentration in the column regions, the tradeoff between breakdown voltage and ON resistance can be improved also in such devices with high breakdown voltage.

Figure 7:
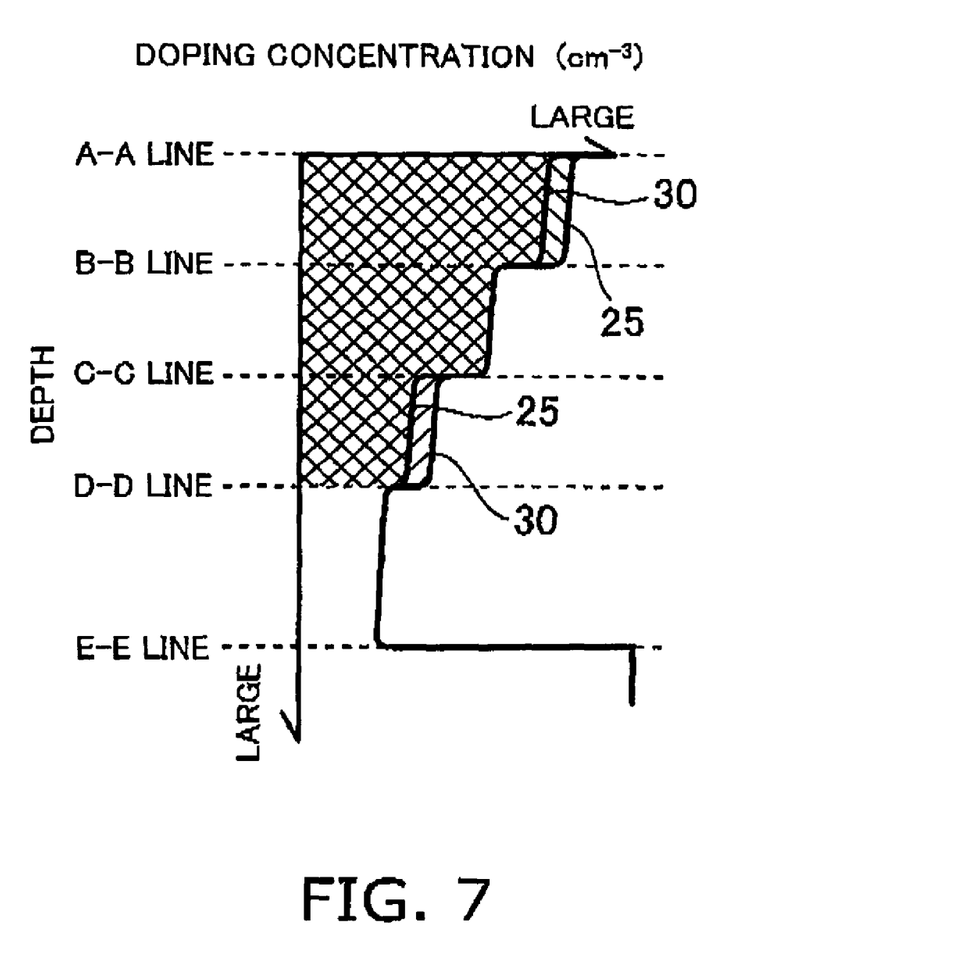
FIG. 7 is a graph showing the depthwise distribution of doping concentration in a semiconductor device of the third example.

Furthermore, a semiconductor device of the embodiment of the invention can have various modifications of doping concentration distributions. FIG. 7 is a graph showing the depthwise distribution of doping concentration in a semiconductor device of a third example. This example is one of modifications of the second example. The doping concentration in the first semiconductor layer is varied as well as the doping concentrations in the first and second semiconductor column regions are varied in the each steps of the doping concentration. In such a semiconductor device with this construction, the tradeoff between breakdown voltage and ON resistance can be also improved.

The embodiment of the invention has been described with reference to examples. However, the invention is not limited to these examples.

For instance, the above examples are illustrated with reference to a MOSFET having an n-channel planar structure. However, the invention is also applicable to a MOSFET having a trench gate structure and a p-channel MOSFET.

The invention has been illustrated with reference to a vertical power MOSFET. However, the device may be a lateral device in which drift current flows laterally. Furthermore, the invention is also applicable to other power semiconductor devices such as IGBT (insulated gate bipolar transistor) and diodes.

The embodiment of the invention is described assuming that the n-type column region 30 and the p-type column region 25 are formed like a stripe perpendicular to the page. However, the arrangement of the column regions is not limited thereto. The invention is applicable to any arrangements of p-type column regions 25 relative to the n-type column regions 30, such as a dot, staggered, and mesh pattern as viewed from the semiconductor surface, if the arrangement can achieve the effect of the (semi-)super junction structure in which the column region is depleted.

There is no limitation to the method for manufacturing a super junction structure that can be used for the semiconductor device 5 of this embodiment. For example, an n⁻-type semiconductor layer 20 is formed on an n⁺-type semiconductor substrate 15. An n-type semiconductor is epitaxially grown on the n⁻-type semiconductor layer 20. Then, by ion implantation, p-type dopant such as boron is selectively implanted to form a p-type semiconductor region. At this time, a mask having strip-shaped openings is provided on the surface of the n-type semiconductor. Thus, by repeating crystal growth and ion implantation, a super junction structure having alternately formed n-type column regions 30 and p-type column regions 25 is obtained.

Alternatively, an n-type semiconductor is epitaxially grown on an n⁻-type semiconductor layer 20. Trenches are opened, and a p-type semiconductor layer is formed in the trench by buried epitaxial growth. Thus a super junction structure having alternately formed n-type column regions 30 and p-type column regions 25 is obtained.

The dimension, shape, conductivity type, doping concentration, and material of each element in the above examples can be modified by suitable selection from the respective ranges known to those skilled in the art. Such modifications achieving functions and effects similar to those of the invention are also encompassed within the scope of the invention.

The invention claimed is:

1. A semiconductor device comprising:
   a semiconductor substrate;
   a first semiconductor layer of a first conductivity type provided on a major surface of the semiconductor substrate and having lower doping concentration than the semiconductor substrate;
   a plurality of first semiconductor column regions of the first conductivity type provided on the first semiconductor layer;
   a plurality of second semiconductor column regions of a second conductivity type provided on the first semiconductor layer, the second semiconductor column regions being adjacent to the first semiconductor column regions;
   a first semiconductor region of the second conductivity type provided on the second semiconductor column region;
   a second semiconductor region of the first conductivity type selectively provided in a surface of the first semiconductor region;
   a gate insulating film extending from the second semiconductor region via the first semiconductor region onto the first semiconductor column region;
   a first main electrode provided on a surface of the semiconductor substrate, the surface being on the opposite side of the major surface;
   a second main electrode provided on the second semiconductor region; and
   a control electrode provided on the gate insulating film configured to control a current path between the second main electrode and the first semiconductor column regions,
   doping concentrations in both the first and second semiconductor column region being low on the near side of the first semiconductor layer and high on the second main electrode side, and
   doping concentration at a bottom of the first semiconductor column region and doping concentration at a bottom of the second semiconductor column region being higher than doping concentration in the first semiconductor layer.

2. The semiconductor device according to claim 1, wherein a difference between the doping concentration in the second semiconductor column region on a side closer to the second main electrode and the doping concentration in the second semiconductor column region on a side closer to the first semiconductor layer is larger than a difference between the doping concentration in the first semiconductor column region on a side closer to the second main electrode and the doping concentration in the first semiconductor column region on a side closer to the first semiconductor layer.

3. The semiconductor device according to claim 1, wherein a total amount of dopant in the first semiconductor column region is comparable with a total amount of dopant in the second semiconductor column region.

4. The semiconductor device according to claim 1, wherein the doping concentration in the first semiconductor layer is lower than the doping concentration in the first semiconductor column region near its interface with the first semiconductor layer.

5. The semiconductor device according to claim 1, wherein a thickness of the second semiconductor column region is not less than 50 percent and not more than 90 percent of a sum of the thickness of the second semiconductor column region and a thickness of the first semiconductor layer.

6. The semiconductor device according to claim 1, wherein the doping concentrations in at least a part of the first semiconductor layer increases substantially vertically upward with respect to a major surface of the first semiconductor layer.

7. The semiconductor device according to claim 1, wherein the doping concentration in the first semiconductor layer is lower than the doping concentration in the second semiconductor column region near its interface with the first semiconductor layer.

8. The semiconductor device according to claim 7, wherein the doping concentration in the first semiconductor layer is lower than the doping concentration in the first semiconductor column region near its interface with the first semiconductor layer.

9. The semiconductor device according to claim 1, wherein the doping concentration in the first semiconductor column region is higher than the doping concentration in the second semiconductor column region on the near side of the first semiconductor layer and lower than the doping concentration in the second semiconductor column region on the far side of the first semiconductor layer.

10. The semiconductor device according to claim 9, wherein a total amount of dopant in the first semiconductor column region is comparable with a total amount of dopant in the second semiconductor column region.

11. The semiconductor device according to claim 1, wherein the doping concentrations in the first and second semiconductor column regions increase stepwise substantially vertically upward with respect to a major surface of the first semiconductor layer.

12. The semiconductor device according to claim 11, wherein the doping concentrations increase stepwise with three or more steps.

13. A semiconductor device comprising:
a semiconductor substrate;
a first semiconductor layer of a first conductivity type provided on a major surface of the semiconductor substrate and having lower doping concentration than the semiconductor substrate;
a plurality of first semiconductor column regions of the first conductivity type provided on the first semiconductor layer;
a plurality of second semiconductor column regions of a second conductivity type provided on the first semiconductor layer, the second semiconductor column regions being adjacent to the first semiconductor column regions;
a first main electrode provided on a surface of the semiconductor substrate, the surface being on the opposite side of the major surface;
a second main electrode provided on the second semiconductor column regions; and
a control electrode for controlling a current path between the second main electrode and the first semiconductor column regions,
a doping concentration in the second semiconductor column region having a distribution that is low on the near side of the first semiconductor layer and high on the far side of the first semiconductor layer,
a doping concentration in the first semiconductor layer being lower than the doping concentration in the second semiconductor column region near its interface with the first semiconductor layer, and
doping concentration at a bottom of the first semiconductor column region and doping concentration at a bottom of the second semiconductor column region being higher than doping concentration in the first semiconductor layer.

14. The semiconductor device according to claim 13, wherein a difference between the doping concentration in the second semiconductor column region on a side closer to the second main electrode and the doping concentration in the second semiconductor column region on a side closer to the first semiconductor layer is larger than a difference between the doping concentration in the first semiconductor column region on a side closer to the second main electrode and the doping concentration in the first semiconductor column region on a side closer to the first semiconductor layer.

15. The semiconductor device according to claim 13, wherein a total amount of dopant in the first semiconductor column region is comparable with a total amount of dopant in the second semiconductor column region.

16. The semiconductor device according to claim 13, wherein the doping concentration in the first semiconductor layer is lower than the doping concentration in the first semiconductor column region near its interface with the first semiconductor layer.

17. The semiconductor device according to claim 13, wherein a thickness of the second semiconductor column region is not less than 50 percent and not more than 90 percent of a sum of the thickness of the second semiconductor column region and a thickness of the first semiconductor layer.

18. The semiconductor device according to claim 13, wherein the doping concentrations in at least a part of the first semiconductor layer increases substantially vertically upward with respect to a major surface of the first semiconductor layer.

19. The semiconductor device according to claim 13, wherein the doping concentration in the second semiconductor column region increases stepwise substantially vertically upward with respect to a major surface of the first semiconductor layer.

20. The semiconductor device according to claim 19, wherein the doping concentrations increase stepwise with three or more steps.

* * * * *